United States Patent
Coskun et al.

(10) Patent No.: US 10,996,572 B2
(45) Date of Patent: May 4, 2021

(54) MODEL BASED DYNAMIC POSITIONAL CORRECTION FOR DIGITAL LITHOGRAPHY TOOLS

(71) Applicant: Applied Materials, Inc., Santa Clara, CA (US)

(72) Inventors: Tamer Coskun, San Jose, CA (US); Muhammet Poyraz, Santa Clara, CA (US); Qin Zhong, Santa Clara, CA (US); Pacha Mongkolwongrojn, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 150 days.

(21) Appl. No.: 16/277,805

(22) Filed: Feb. 15, 2019

(65) Prior Publication Data

US 2020/0264514 A1 Aug. 20, 2020

(51) Int. Cl.
   *G03F 7/20* (2006.01)
(52) U.S. Cl.
   CPC ............ *G03F 7/7065* (2013.01); *G03F 7/705* (2013.01); *G03F 7/70516* (2013.01); *G03F 7/70625* (2013.01); *G03F 7/70633* (2013.01)
(58) Field of Classification Search
   CPC ........... H01L 21/67248; G03F 7/70633; G03F 7/705; G06N 20/00
   See application file for complete search history.

(56) References Cited

U.S. PATENT DOCUMENTS

| | | | |
|---|---|---|---|
| 6,826,743 B2 | 11/2004 | Park et al. | |
| 7,184,853 B2 | 2/2007 | Roberts et al. | |
| 7,645,546 B2 | 1/2010 | Yang et al. | |
| 9,430,593 B2 | 8/2016 | Vukkadala et al. | |
| 2005/0136346 A1 | 6/2005 | Ottens et al. | |
| 2005/0167514 A1* | 8/2005 | Kaushal | G03F 1/78 236/1 C |
| 2006/0119830 A1 | 6/2006 | Ottens et al. | |
| 2007/0076180 A1 | 4/2007 | Tinnemans et al. | |
| 2010/0114522 A1 | 5/2010 | Chung | |

(Continued)

FOREIGN PATENT DOCUMENTS

| | | |
|---|---|---|
| JP | 2006293314 A | 10/2006 |
| JP | 2009238922 A | 10/2009 |

OTHER PUBLICATIONS

International Search Report and the Written Opinion for International Application No. PCT/US2020/013861 dated May 11, 2020, 9 pages.

(Continued)

*Primary Examiner* — Ross Varndell
(74) *Attorney, Agent, or Firm* — Patterson + Sheridan LLP

(57) ABSTRACT

The present disclosure generally relates to photolithography systems, and methods for correcting positional errors in photolithography systems. When a photolithography system is first started, the system enters a stabilization period. During the stabilization period, positional readings and data, such as temperature, pressure, and humidity data, are collected as the system prints or exposes a substrate. A model is created based on the collected data and the positional readings. The model is then used to estimate errors in subsequent stabilization periods, and the estimated errors are dynamically corrected during the subsequent stabilization periods.

21 Claims, 11 Drawing Sheets

(56) References Cited

U.S. PATENT DOCUMENTS

| | | |
|---|---|---|
| 2010/0321654 A1 | 12/2010 | Den Boef |
| 2018/0136541 A1 | 5/2018 | Rafac |
| 2018/0275525 A1 | 9/2018 | Bow et al. |
| 2018/0322237 A1 | 11/2018 | Ten Berge et al. |
| 2018/0358271 A1 | 12/2018 | David |
| 2020/0096872 A1* | 3/2020 | Bow ................ G03F 7/705 |

OTHER PUBLICATIONS

Taiwan Office Action dated Jan. 12, 2021 for Application No. 109102168.

* cited by examiner

MODEL BASED DYNAMIC POSITIONAL CORRECTION FOR DIGITAL LITHOGRAPHY TOOLS

BACKGROUND

Field

Embodiments of the present disclosure generally relate to photolithography systems, and methods for correcting positional errors in photolithography systems.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

However, the tool used for such microlithography techniques can take 8 hours or longer to fully stabilize the printing and patterning behavior, during which time the patterning of the photoresist may be uneven due to various effects, such as thermal variations. The tool comprises numerous heat sources and components that have different conductivity coefficients and thermal capacitances, each potentially contributing to the variations causing the uneven patterning, resulting in a negative effect on total pitch and overlay correction repeatability.

In order to continue to provide display devices and other devices to consumers at the prices demanded by consumers, new apparatuses, approaches, and systems are needed to precisely and cost-effectively create patterns on substrates, such as large area substrates.

SUMMARY

The present disclosure generally relates to photolithography systems, and methods for correcting positional errors in photolithography systems. When a photolithography system is first started, the system enters a stabilization period. During the stabilization period, positional readings and data, such as temperature, pressure, and humidity data, are collected as the system prints or exposes a substrate. A model is created based on the collected data and the positional readings. The model is then used to estimate errors in subsequent stabilization periods, and the estimated errors are dynamically corrected during the subsequent stabilization periods.

In one embodiment, a method comprises starting a photolithography system and entering a stabilization period, collecting data and positional readings as the photolithography system prints during the stabilization period, creating a model based on the data and the positional readings, and dynamically correcting estimate errors during subsequent stabilization periods using the model.

In another embodiment, a method comprises starting a photolithography system and entering a stabilization period and collecting temperature data and positional readings as the photolithography system prints during the stabilization period. The temperature data is collected during heating and cooling periods. The model further comprises creating a model based on the temperature data and the positional readings, calibrating the model, using the calibrated model to estimate errors in subsequent stabilization periods, and dynamically correcting the estimated errors during the subsequent stabilization periods.

In yet another embodiment, a method comprises starting a photolithography system and entering a stabilization period, collecting temperature data and positional readings as the photolithography system prints during the stabilization period, creating a model based on the temperature data and the positional readings, forming an optimization problem to determine thermal capacitance and transmission coefficients of the photolithography system, using the model and optimization problem to estimate errors in subsequent stabilization periods, and dynamically correcting the estimated errors during the subsequent stabilization periods.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to photolithography systems, and methods for correcting positional errors in photolithography systems. When a photolithography system is first started, the system enters a stabilization period. During the stabilization period, positional readings and data, such as temperature, pressure, and humidity data, are collected as the system prints or exposes a substrate. A model is created based on the collected data and the positional readings. The model is then used to estimate errors in subsequent stabilization periods, and the estimated errors are dynamically corrected during the subsequent stabilization periods.

Figure 1A:
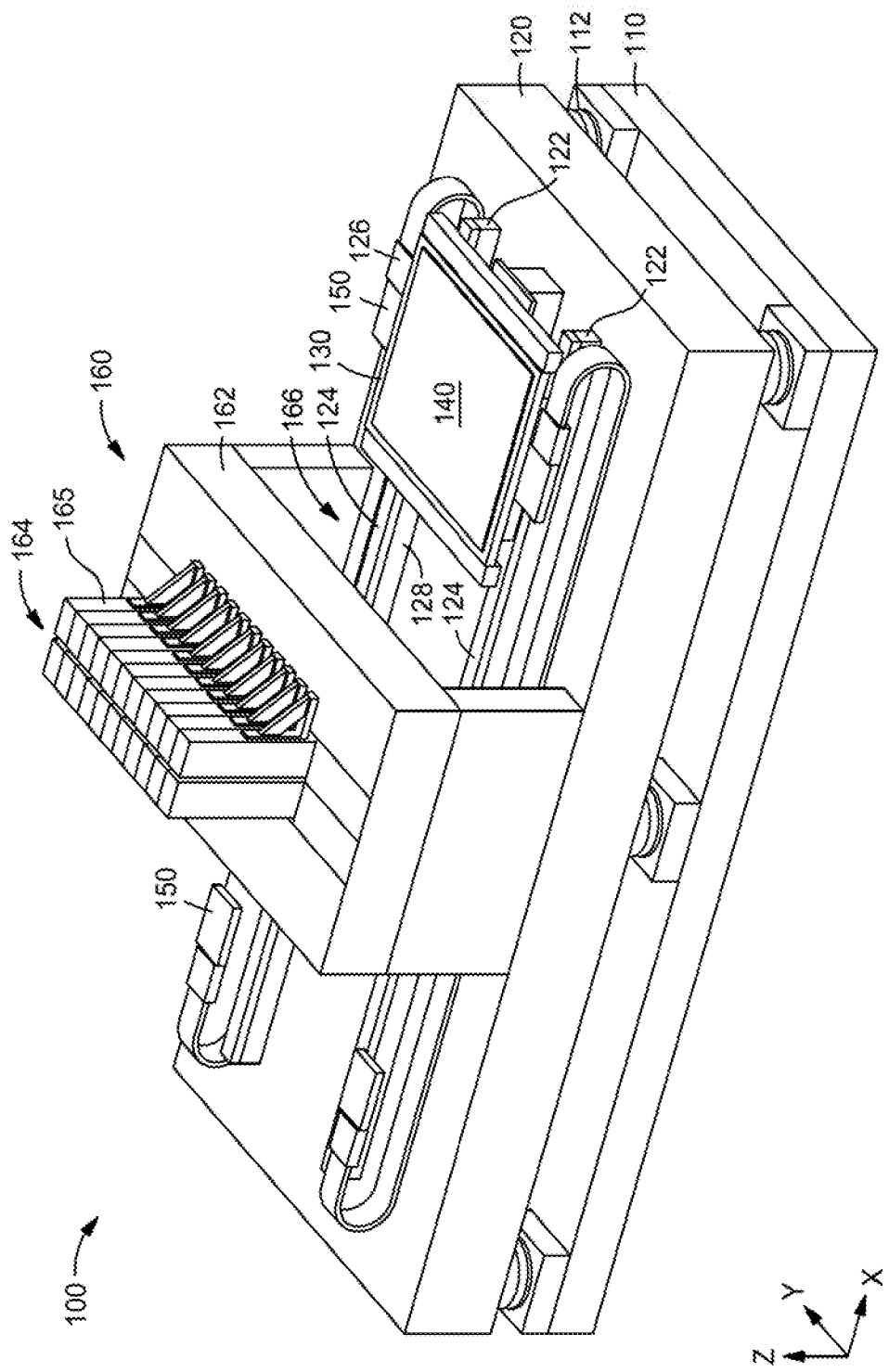
FIG. 1A is a perspective view of a photolithography system, according to one embodiment.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example Alkaline Earth Boro-Aluminosilicate, used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly(methyl methacrylate), poly (methyl glutarimide), and SU-8. In this manner, the pattern is created on a surface of the substrate 140 to form the electronic circuitry.

The system 100 includes a pair of supports 122 and a pair of tracks 124. The pair of supports 122 is disposed on the slab 120, and, in one embodiment, the slab 120 and the pair of supports 122 are a single piece of material. The pair of tracks 124 is supported by the pair of the supports 122, and the stage 130 moves along the tracks 124 in the x-direction. In one embodiment, the pair of tracks 124 is a pair of parallel magnetic channels. As shown, each track 124 of the pair of tracks 124 is linear. In another embodiment, air bearings are utilized for high accurate non-contact motion, and linear motors are configured to provide the force to move the stage 130 back and forth in the x-direction and the y-direction. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIG. 2). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the x-direction from a loading position, as shown in FIG. 1A, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or z-axis. The angular position measurement can be used to hold the angular position constant during scanning by means of a servo mechanism or it can be used to apply corrections to the positions of the patterns being written on the substrate 140 by the image projection apparatus 270, shown in FIG. 2. These techniques may be used in combination.

Figure 1B:
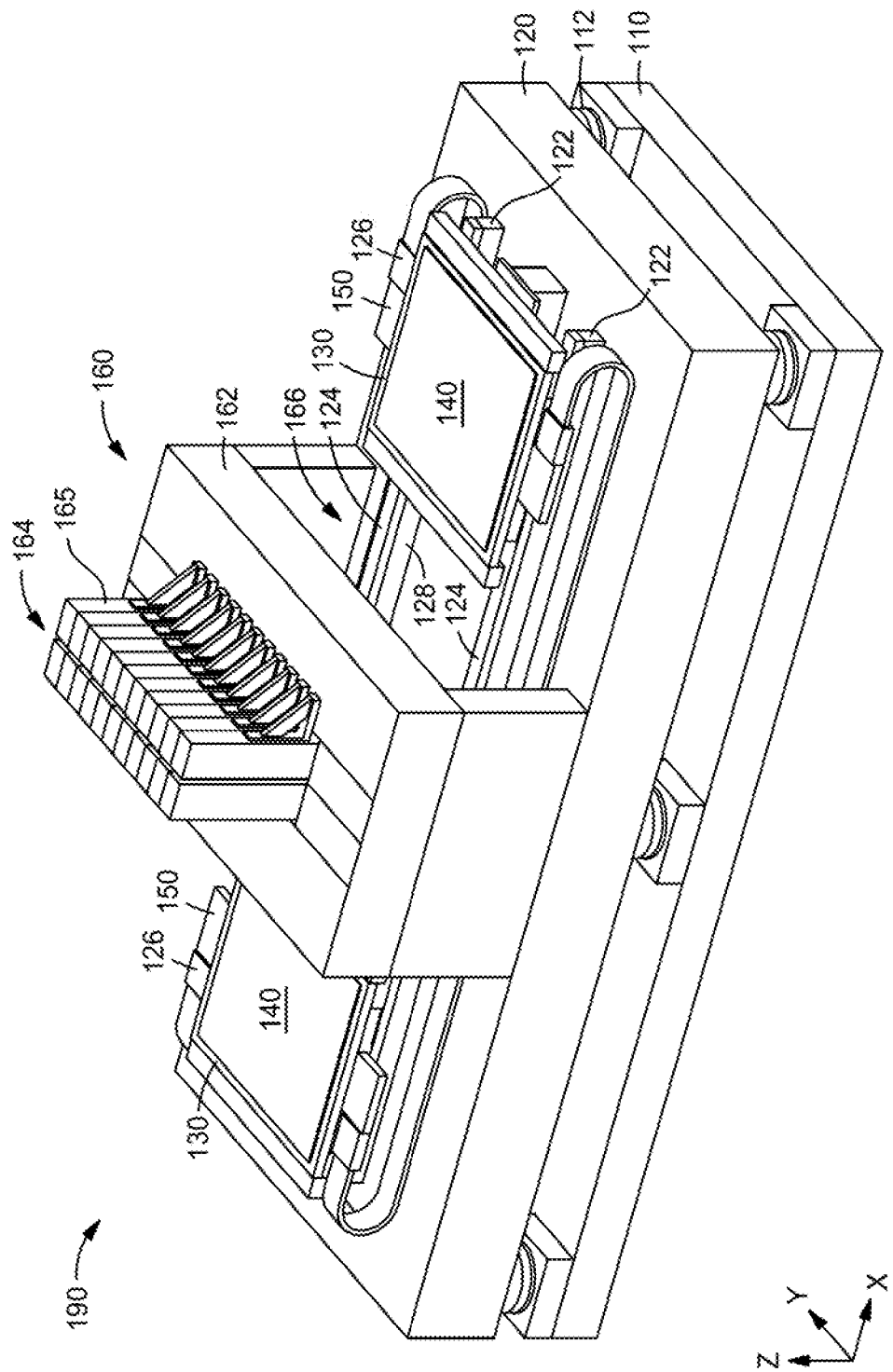
FIG. 1B is a perspective view of a photolithography system, according to another embodiment.

FIG. 1B is a perspective view of a photolithography system 190 according to embodiments disclosed herein. The system 190 is similar to the system 100; however, the system 190 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2:
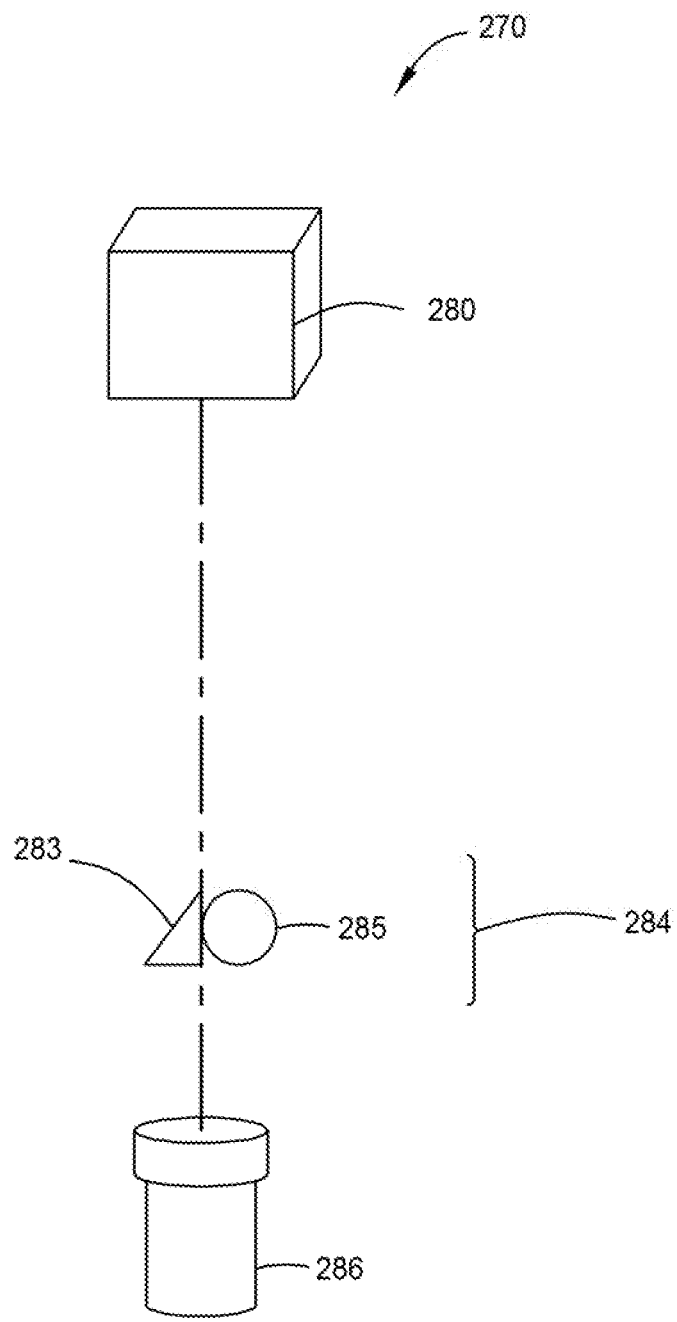
FIG. 2 is a perspective schematic view of an image projection apparatus, according to embodiments disclosed herein.

FIG. 2 is a perspective schematic view of an image projection apparatus 270 according to one embodiment, which is useful for a photolithography system, such as system 100 or system 190. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, digital micromirror devices (DMDs), liquid crystal displays (LCDs), and vertical-cavity surface-emitting lasers (VCSELs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 190 is correct or within an predetermined tolerance. The projection optics 286, such as one or more lenses, is used to project the light onto the substrate, such as the substrate 140.

When the photolithography systems 100, 190 are first started, the systems 100, 190 enter a stabilization period. The stabilization period is the amount of time it takes the printing and patterning behavior of the system to stabilize (i.e., how long it takes the system to warm up completely). During the stabilization period of the photolithography systems 100, 190, various effects and variations occur, such as thermal variations, which may have a negative effect on total pitch and overlay correction repeatability. In some instances, it can take the photolithography systems 100, 190 eight hours or more to stabilize the printing and patterning behavior due to the various effects and variations. Additionally, each system 100, 190 comprises numerous heat sources and components that have different conductivity coefficients and thermal capacitances, each potentially contributing to the variations, making it difficult to monitor the systems 100, 190 rigorously.

To use the systems 100, 190 during the stabilization period to expose substrates with precision and accuracy, a model based software correction may be utilized to correct any errors arising during the stabilization period. The behaviors of the system 100, 190 may be modeled and calibrated to estimate potential variations occurring during the stabilization period, as described below in FIG. 3, to enhance the total pitch and overlay correction repeatability. The models may then be used to correct overlay and total pitch errors during subsequent stabilization periods of the systems 100, 190. Utilizing the models for dynamic positional corrections may eliminate or reduce costly hardware solutions. Furthermore, the models may be used for dynamic positional corrections since the positional corrections are applied to digital masks.

Figure 3:
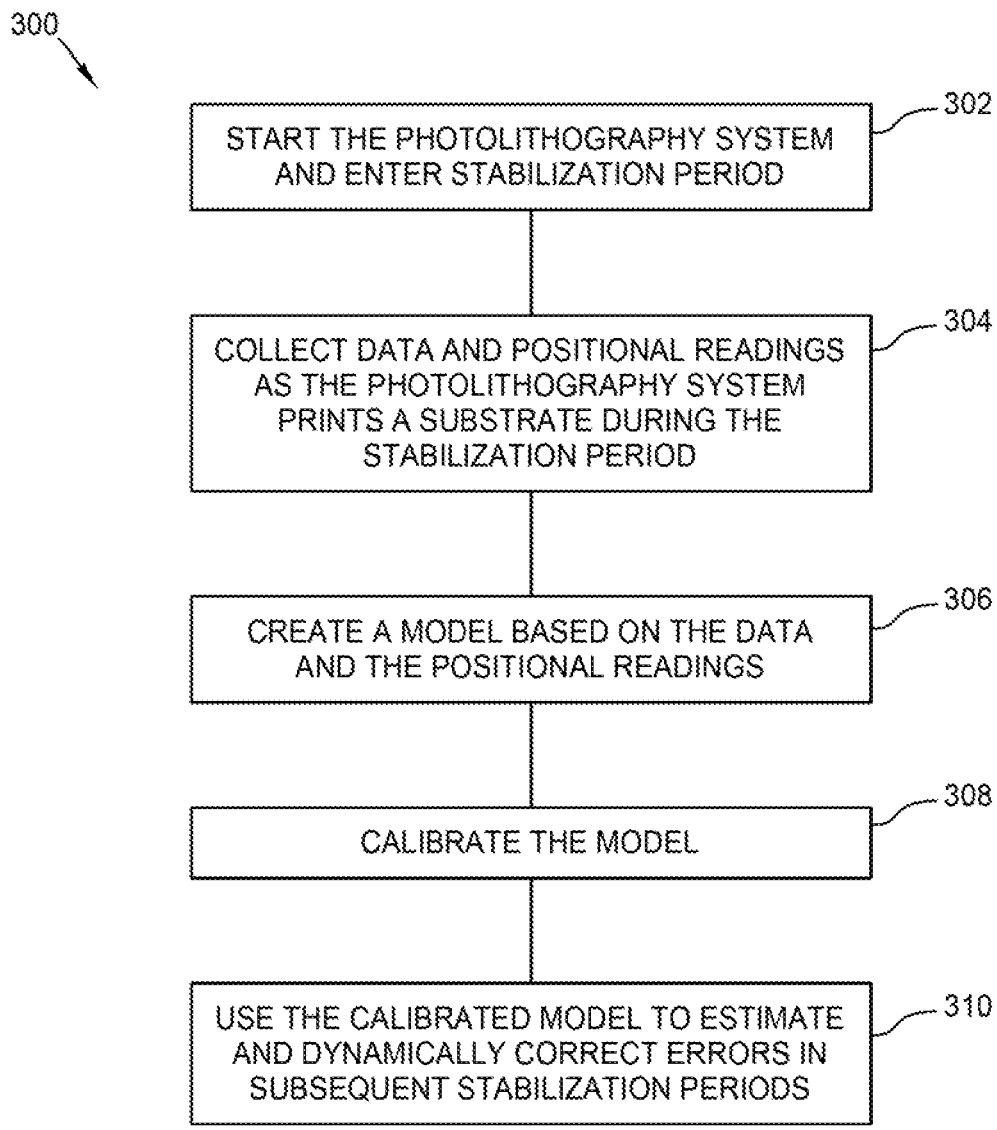
FIG. 3 illustrates a method of modeling and calibrating system behaviors to estimate positional perturbations occurring during the stabilization period, according to embodiments disclosed herein.

FIG. 3 illustrates a method 300 of modeling and calibrating system behaviors to estimate positional perturbations occurring during the stabilization period, according to embodiments disclosed herein. Method 300 may be utilized with the photolithography systems 100, 190 of FIGS. 1A and 1B, respectively.

Method 300 beings with operation 302, where a photolithography system is started and enters the stabilization period. While in the stabilization period, the printing and patterning behavior of the system may be unstable due to various effects and variations, such as thermal, pressure, and/or humidity variations. The stabilization period is the amount of time it takes the printing and patterning behavior of the system to stabilize (i.e., how long it takes the system to warm up completely).

In operation 304, data and positional readings are collected as the photolithography system prints or exposes a substrate during the stabilization period. Data is gathered continuously as the system aligns and exposes a substrate to mimic a production line. In one embodiment, the data collected is temperature data. Temperature data may be collected using one or more temperature sensors disposed near parts of the tool known to fluctuation in temperature during heating and cooling, such as an encoder. For example, about 20 temperature sensors may be disposed on the photolithography tool to collect and monitor the temperature of the chuck, the encoder, and the bridge/riser, etc.

To collect positional readings, alignment marks (shown in FIG. 5) on a calibration plate or substrate may be captured periodically throughout the stabilization period. The calibration plate may be used during the stabilization period as a reference. Additionally or alternatively, an encoder count change with respect to an interferometer reading may further be recorded periodically, where the interferometer is used as a reference. Relative positional changes with respect to the reference used are then recorded.

A pattern printing position on a substrate or calibration plate may be unintentionally perturbed due to thermal effects and fluctuations occurring during the stabilization period. As such, perturbations of the positional readings on the substrate or calibration plate may be directly related to fluctuations in the temperature. Other effects may cause perturbations of the positional readings as well, such as pressure, humidity, etc. In such cases, sensors configured to collect pressure data, humidity data, etc., may be utilized instead of temperature sensors, or in addition to the temperature sensors. However, thermal effects will be used as an example throughout.

Figure 4A:
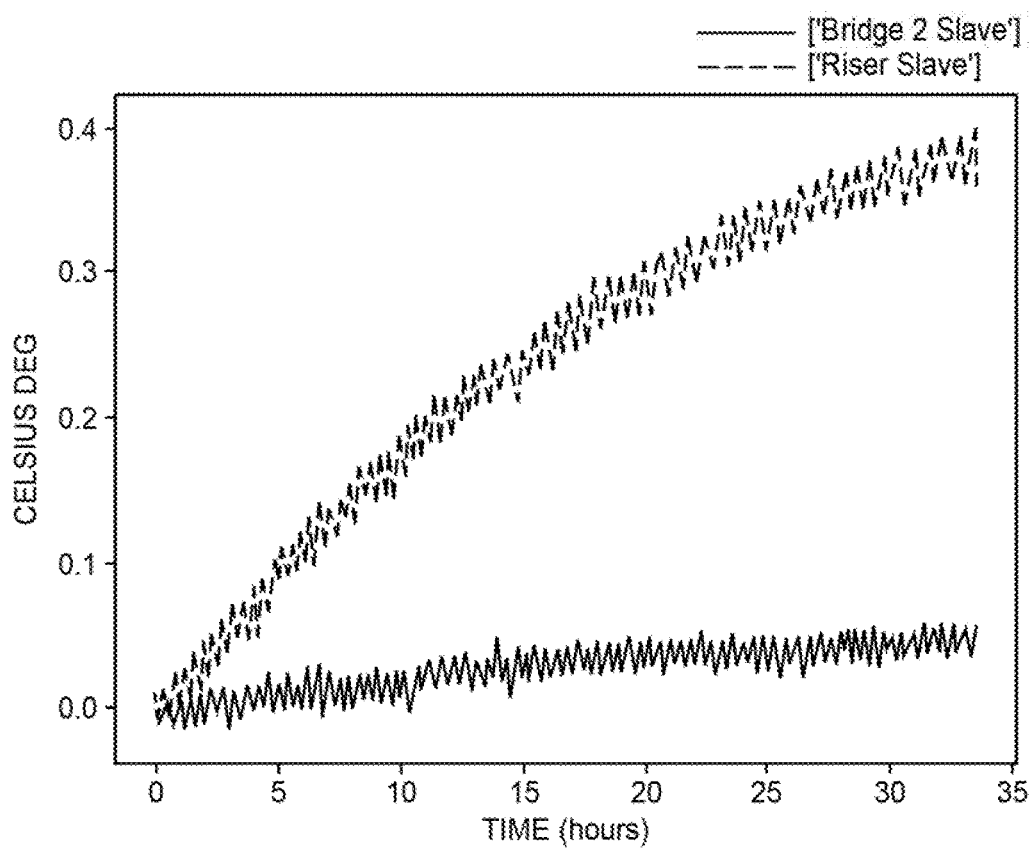
FIGS. 4A-4F illustrate example graphs of data measurements, according to embodiments disclosed herein.
Figure 4B:
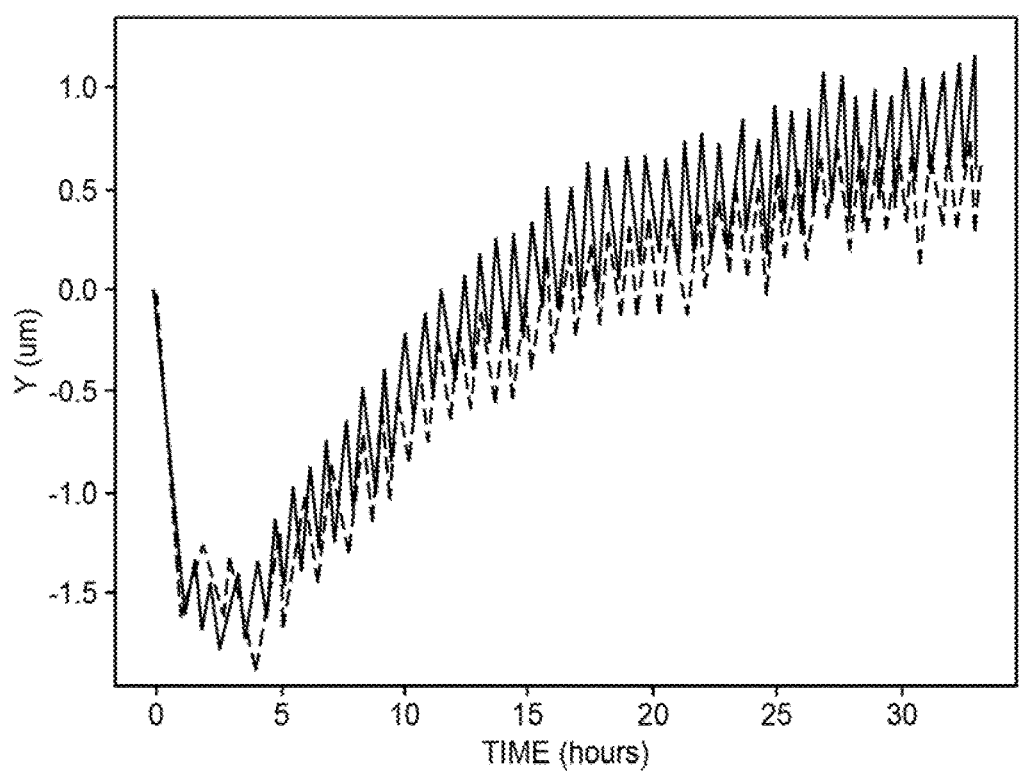
Figure 4C:
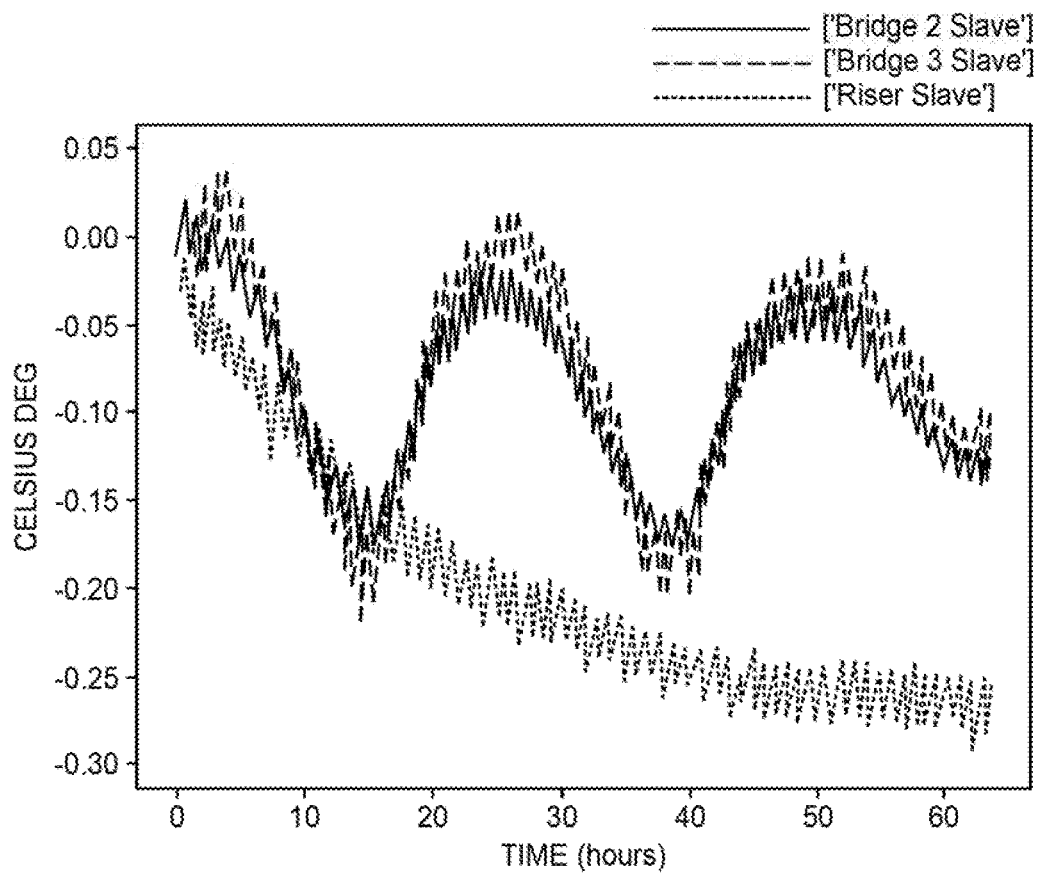
Figure 4D:
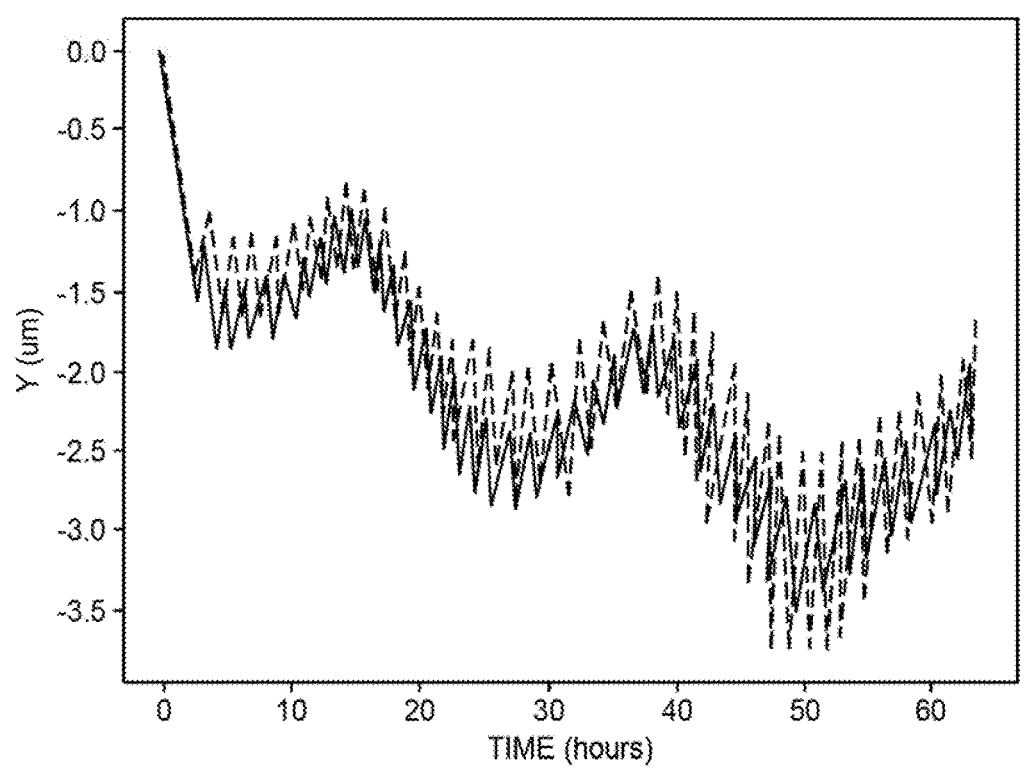
Figure 4E:
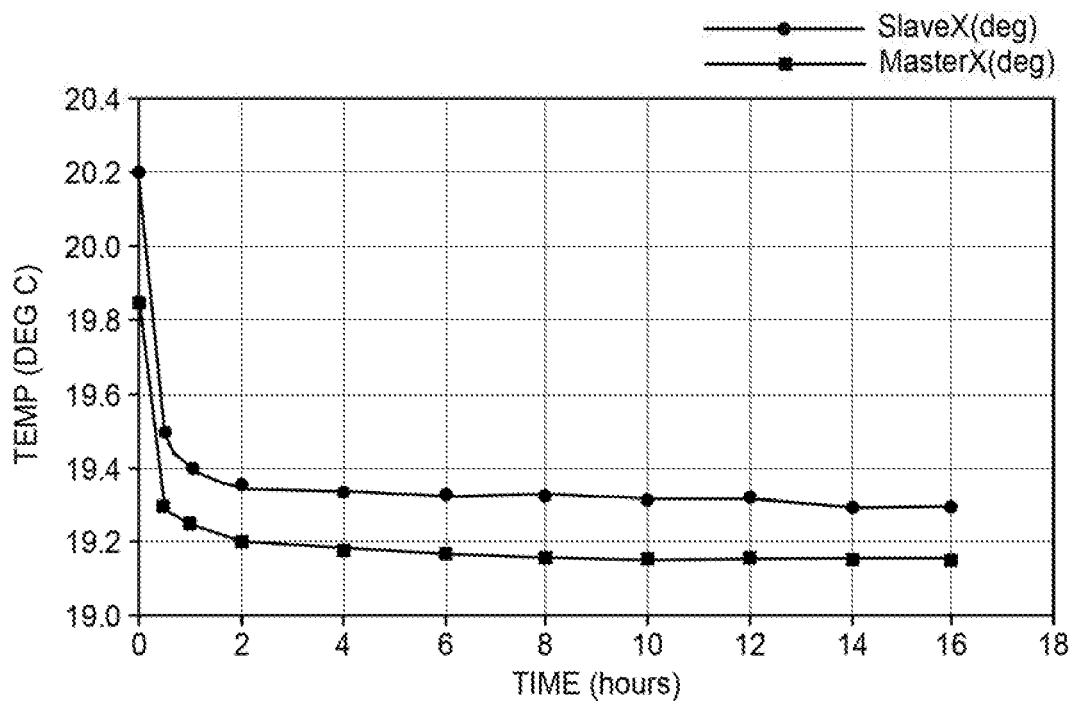
Figure 4F:
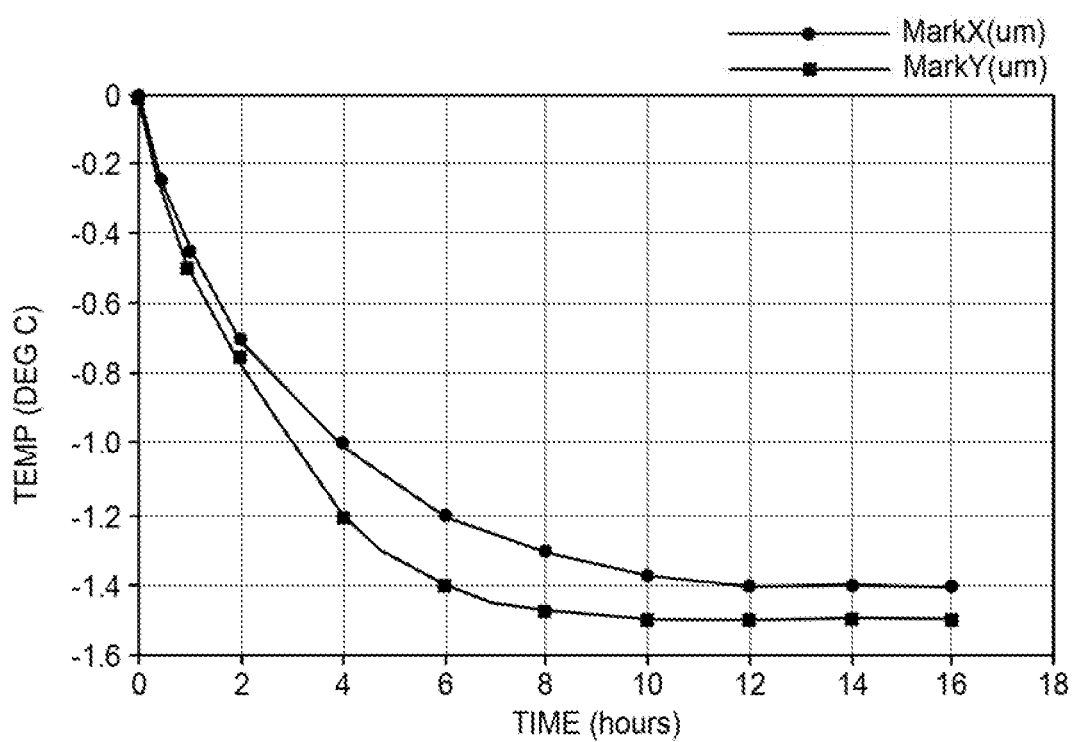

FIGS. 4A-4F illustrate example graphs of data measurements and positional readings. FIGS. 4A-4F are merely examples of data measurements, and are not intended to be limiting. FIG. 4A illustrates the change in temperature in Celsius over a period of time for a bridge component and a riser component in a system at a stage speed of 200 mm/s. FIG. 4B illustrates the corresponding positional mark along the y-axis in micrometers found during heat up for the bridge component and the riser component at a stage speed of 200 mm/s, which shows the positional perturbations due to thermal effects. FIG. 4C illustrates the change in temperature in Celsius over a period of time for a first bridge component, a second bridge component, and a riser component in a system at a stage speed of 100 mm/s. FIG. 4D illustrates the corresponding positional mark along the y-axis in micrometers found during heat up for the bridge component and the riser component at a stage speed of 100 mm/s, which further shows the y-axis positional perturbations due to thermal effects. FIG. 4E illustrates a temperature reading in Celsius over a period of time for master and slave motors that move the stage in a photolithography system. FIG. 4F illustrates a positional mark found during a cooling period along the x-axis and y-axis over a period of time. FIGS. 4A-4F illustrate that the behavior of the system during the stabilization may be represented mathematically.

Figure 5:
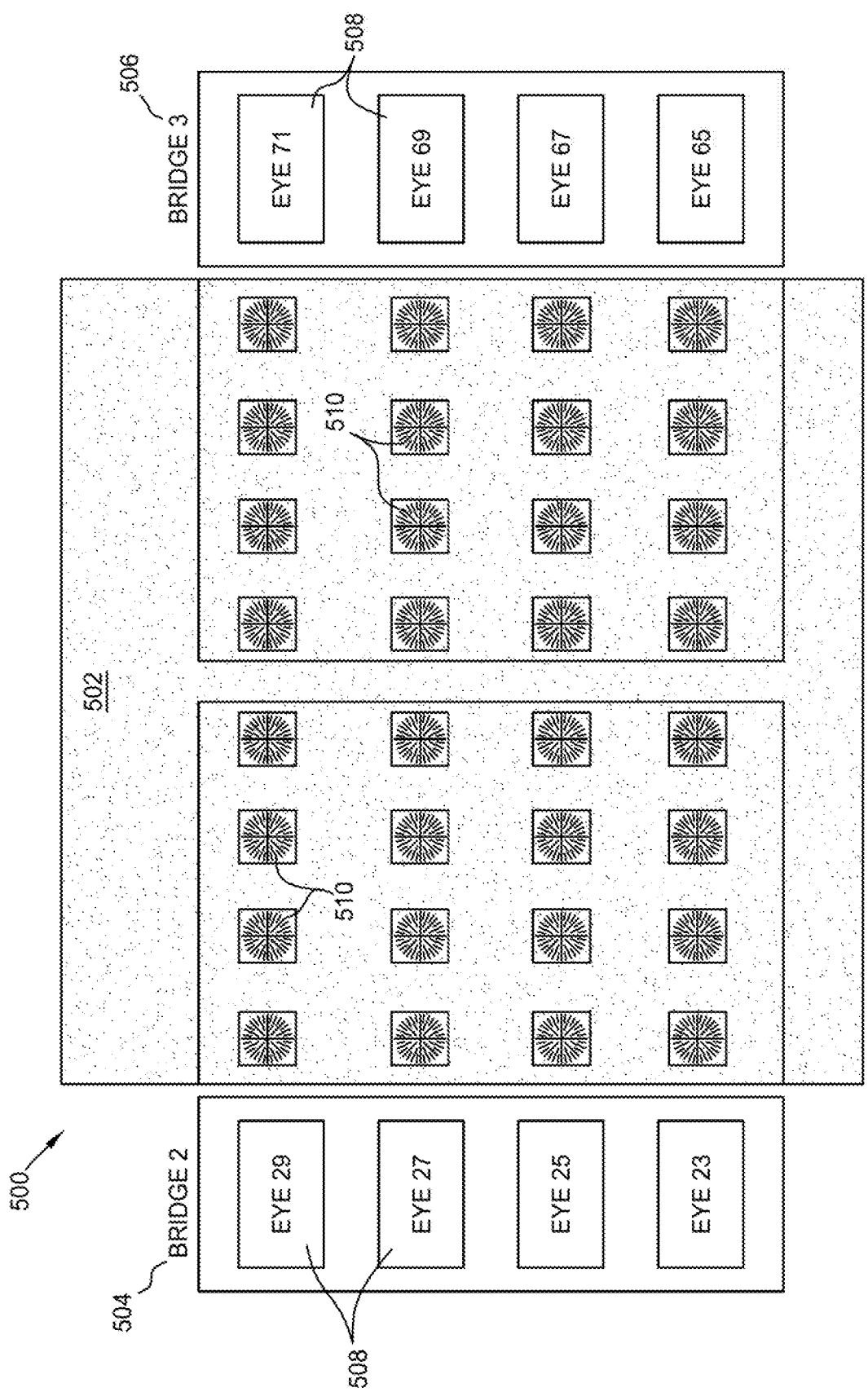
FIG. 5 illustrates an alignment configuration of a first bridge component and a second bridge component each having a plurality of eyes disposed thereon, according to embodiments disclosed herein.

FIG. 5 illustrates an alignment configuration 500 of a first bridge component 504 and a second bridge component 506 component each having a plurality of eyes 508 disposed thereon, according to one embodiment. The alignment configuration 500 may be used to collect the data of the graphs shown in FIGS. 4A-4F above, and to collect the data of the graphs shown in FIGS. 6A-6C and FIGS. 7A-7C shown below. The first bridge component 504 and the second bridge component 506 are disposed above a substrate or plate 502. The plate 502 comprises a plurality of alignment marks 510. While 32 alignment marks 510 are shown, any number of alignment marks may be utilized. Additionally, while two bridge components 504, 506 are shown, additional bridge components may be utilized in the photolithography system, and each bridge component 504, 506 may have more than 4 eyes disposed thereon. The alignment configuration 500 may comprise an exposure unit having a camera (not shown) utilized to collect the positional readings.

Figure 6A:
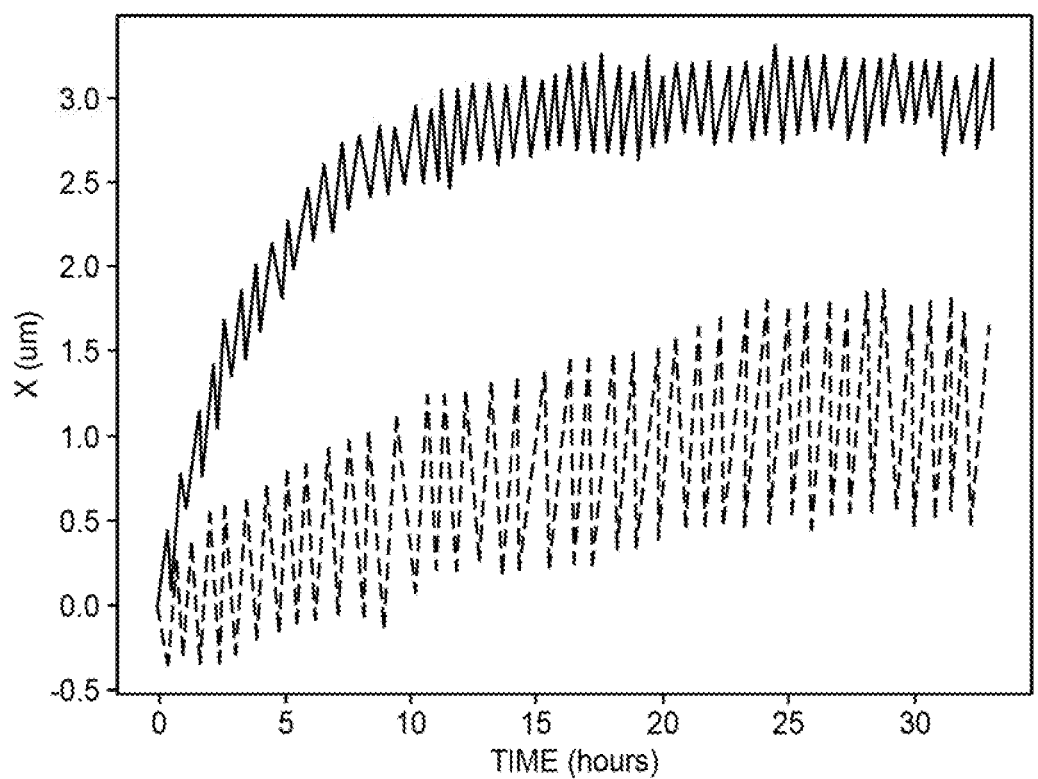
FIGS. 6A-6C illustrate example graphs of data measurements and positional readings at a stage speed of 200 mm/s, according to embodiments disclosed herein.
Figure 6B:
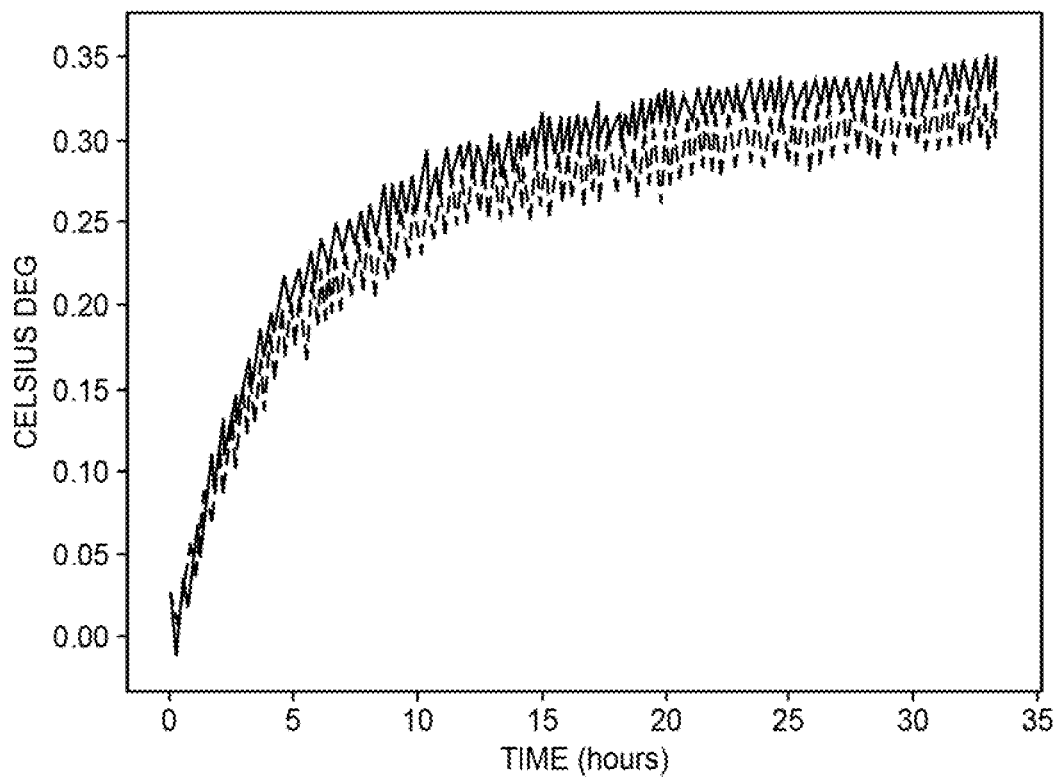
Figure 6C:
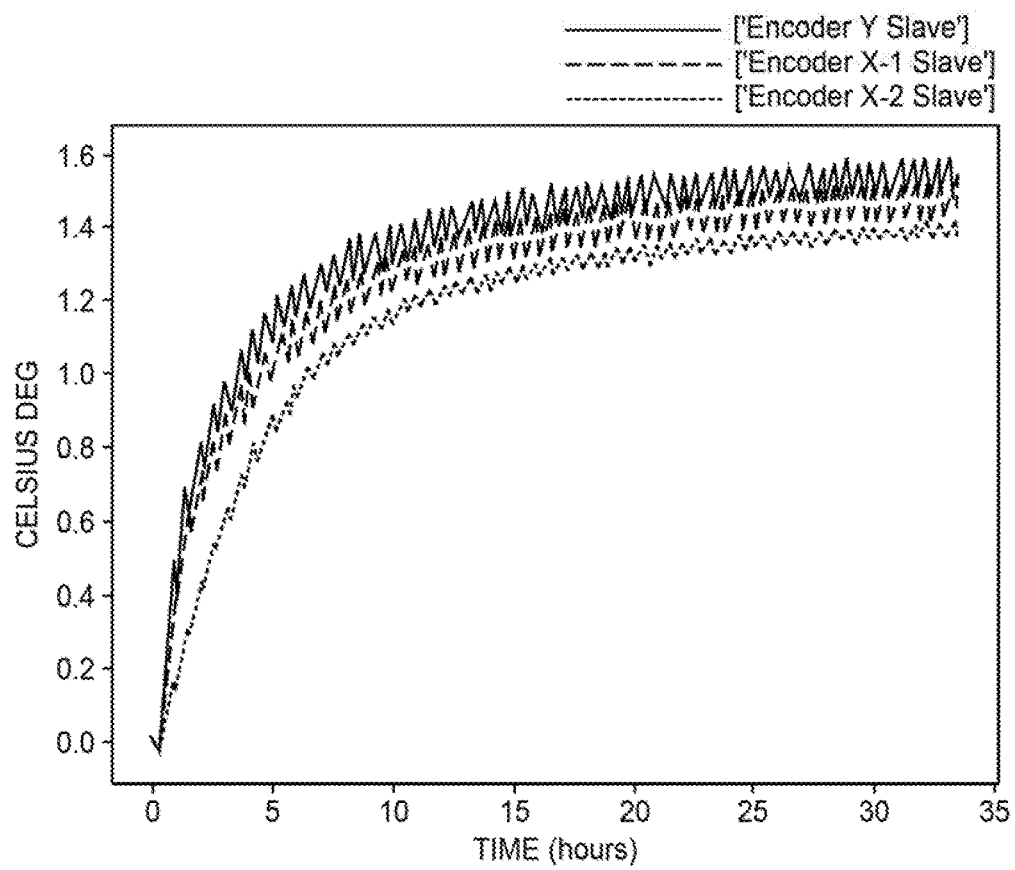
Figure 7A:
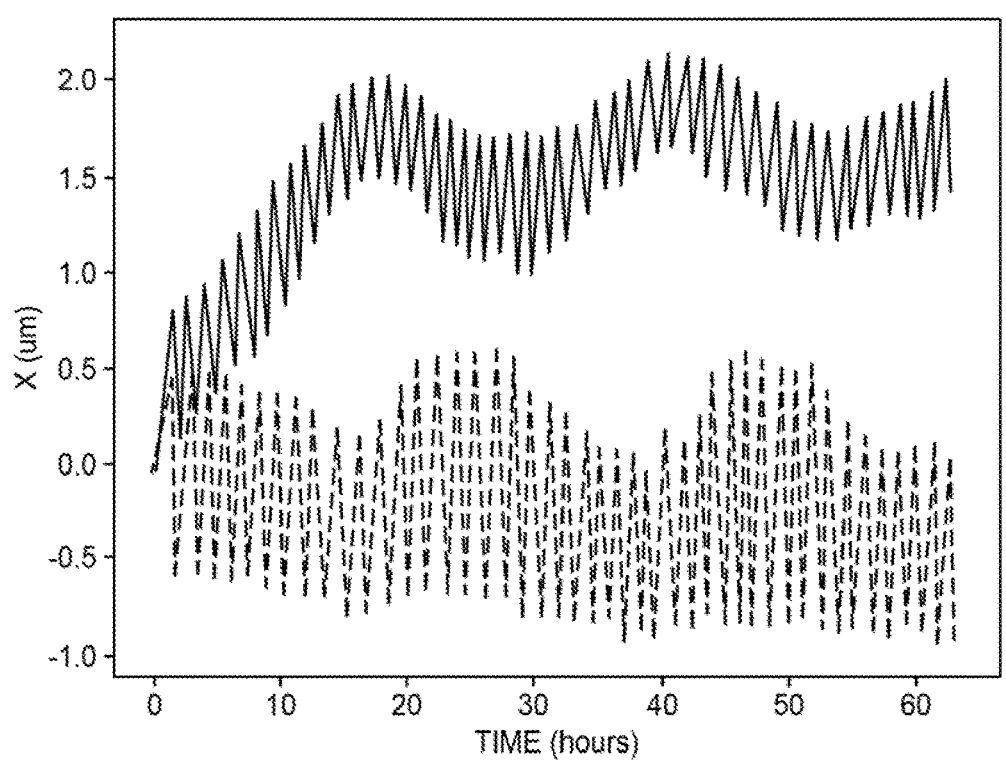
FIGS. 7A-7C illustrate example graphs of data measurements and positional readings at a stage speed of 100 mm/s, according to embodiments disclosed herein.
Figure 7B:
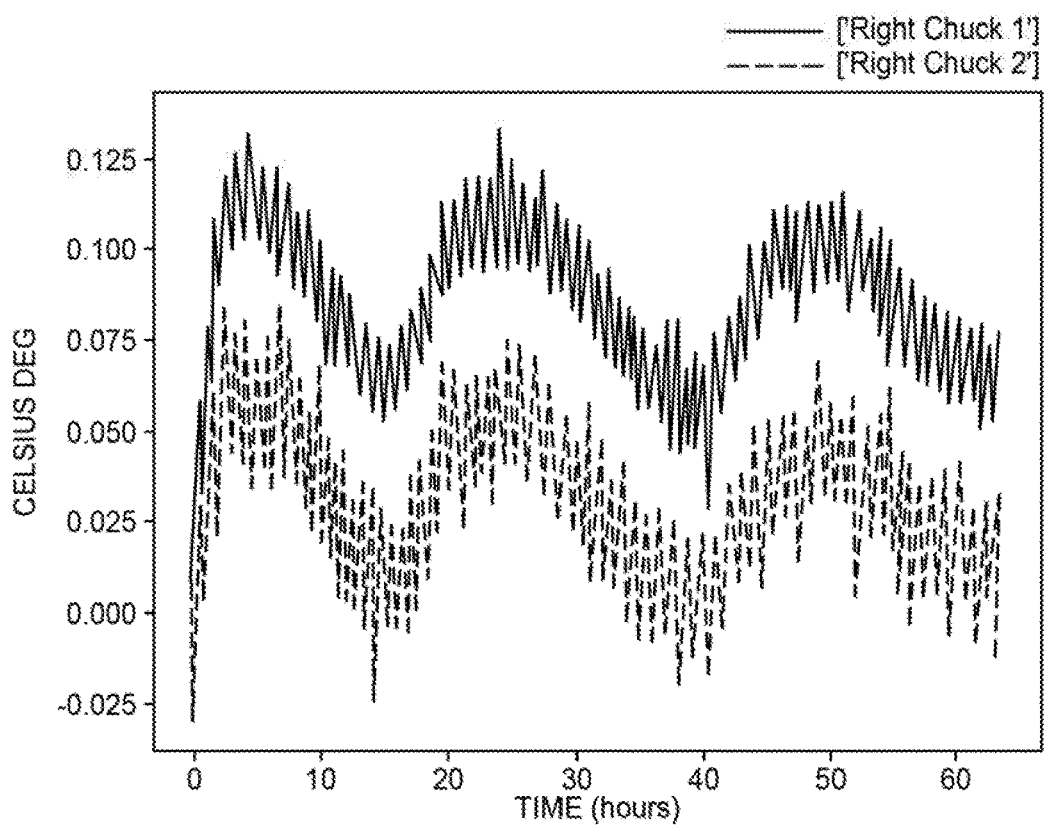
Figure 7C:
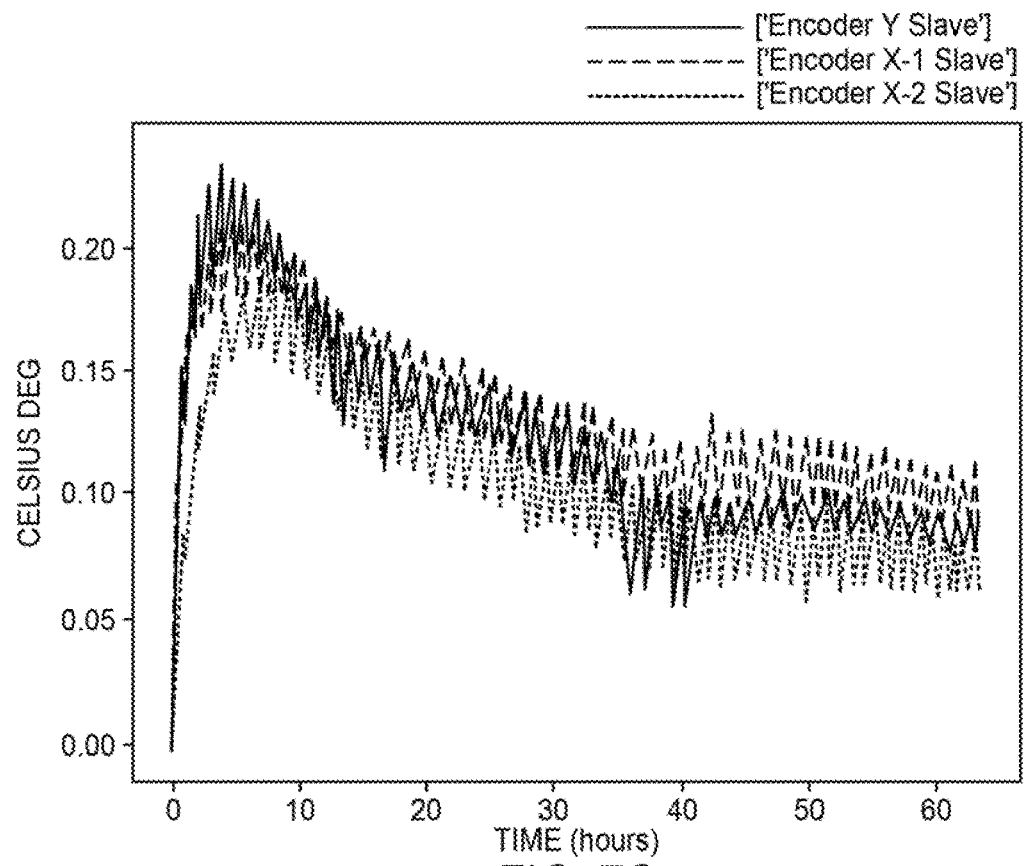

FIGS. 6A-6C illustrate example graphs of data measurements and positional readings at a stage speed of 200 mm/s. FIGS. 7A-7C illustrate example graphs of data measurements and positional readings at a stage speed of 100 mm/s. FIGS. 6A-6C and 7A-7C are merely examples of data measurements, and are not intended to be limiting. The temperature and positional data displayed in the graphs of FIGS. 6A-6C and FIGS. 7A-7C may be collected or measured using any number of temperature sensors and any number of positional marks disposed on a plate.

FIG. 6A and FIG. 7A illustrate a found positional mark along the x-axis in micrometers over a period of time in hours during the stabilization period, which shows the x-axis positional perturbations due to thermal effects. FIG. 6B and FIG. 7B illustrate the temperature measured at two different locations on a chuck of the system in degrees Celsius over a period of time in hours during the stabilization period. FIG. 6C and FIG. 7C illustrate the temperature of a first encoder, a second encoder, and a third encoder of the system in degrees Celsius over a period of time in hours during the stabilization period.

In operation 306, a model is created based on the collected data and positional readings. The model may include more than one subset of data, such as having as a model created to take temperature effects, pressure effects, and/or humidity effects, etc. into consideration. When creating the model, an assumption is made that the systems are linear or weakly non-linear. The model may use effective thermal capacitance and transmission as model parameters. The model may further take into account that the systems operate in a repetitive fashion. The data graphed in one or more of the FIGS. 4A-4F, 6A-6C, and 7A-7C may be used independently or in combination to help create the model.

Additionally, a dynamic eye-to-eye and/or bridge-to-bridge model may be incorporated into the created model. The model may capture the variation of eye centers with respect to one another or the drift of the separation between bridges, such as the first and second bridge components 504, 506 and the eyes 508 of FIG. 5. The dynamic eye-to-eye and/or bridge-to-bridge models may be empirical models, and the model parameters may be calibrated based on the experimental results.

Operations 302 and 304 may be repeated one or more times to collect a greater amount of data to use to create the model. The model may be a cascaded transient model that can relate positional errors to multiple sensor readings. The transient response of each component is determined by the component's thermal capacitance or mass, as well as thermal transmission properties. The cascaded empirical models may then be used to represent thermal effects in the system.

The model is formed using the following variables or parameters: where the positional readings should be at (x, y) during the stabilization period without thermal effects, where the positional readings actually are (x', y') due to thermal effects, approximations of where perturbations of the positional readings are (Δx, Δy) (i.e., the difference between positional readings without thermal effects and the positional readings with thermal effects), an initial temperature ($T_0$), and the change in temperature from the initial temperature reading (ΔT). In one embodiment, at least the initial temperature ($T_0$) and the change in temperature from the initial temperature reading (ΔT) must be known in order to form the model. To approximate the where the positional readings actually are due to thermal effects, equations 1-4 may be used.

$$x' = x + \Delta x(x, y, \overline{\Delta T}, \overline{T_0}) \quad \text{Equation 1:}$$

$$y' = y + \Delta y(x, y, \overline{\Delta T}, \overline{T_0}) \quad \text{Equation 2:}$$

$$\Delta x(x, y, \overline{\Delta T}, \overline{T_0}) \approx \Sigma_{i=1}^{N} \alpha_{xi}(\Delta T_i, T_{i0}) \phi_{xi}(x, y) \quad \text{Equation 3:}$$

$$\Delta y(x, y, \overline{\Delta T}, \overline{T_0}) \approx \Sigma_{i=1}^{N} \alpha_{yi}(\Delta T_i, T_{i0}) \phi_{yi}(x, y) \quad \text{Equation 4:}$$

In equation 3 and equation 4, φ is a spatial mode, and α is a model transformation between the temperature and overall positional changes. The positional perturbations (Δx, Δy) are formulated as a function of all temperature sensor readings, including both previous readings and current readings.

In operation 308, the model is calibrated. Calibrating the model may comprise continuously operating the photolithography system to model the stabilization period, and keeping the photolithography system idle following the stabilization period to model a cool down period. The model is further calibrated by forming an optimization problem. The optimization problem is formed to obtain the model parameters to minimize an overall cost function (C) (shown in equation 7 below). Cost is defined as the summation of the difference between the measurement and the model prediction at multiple positions (x, y) and multiple temperature conditions to represent the transition. The optimization problem may be formed to minimize the cost function.

The optimization problem is formed to determine multiple thermal capacitance and transmission coefficients of the system during the stabilization period. The input of the optimizer is the collected temperature readings and corresponding positional errors at multiple positions. The output of the optimizer is a set of thermal capacitance and transmission coefficients. The optimizer may minimize the difference between a measured position on the substrate and the model estimated position. The model may be calibrated using equations 5-7. Equations 5 and 6 are used for model prediction errors, where $x'_{meas}$ and $y'_{meas}$ are the measured positional changes due to thermal effects. Equation 7 is the cost function, where K is the number of collected data and L is the number of calibrated parameters.

$$\varepsilon_x(x, y) = x'_{meas} - x' \quad \text{Equation 5}$$

$$\varepsilon_y(x, y) = y'_{meas} - y' \quad \text{Equation 6}$$

$$C = \sqrt{\frac{1}{LK}\left(\Sigma_{k=1}^{K}\Sigma_{l=1}^{L}\varepsilon_x^{k,l}\right)^2} + \sqrt{\frac{1}{LK}\left(\Sigma_{k=1}^{K}\Sigma_{l=1}^{L}\varepsilon_y^{k,l}\right)^2} \quad \text{Equation 7}$$

In operation 310, the calibrated model is used to estimate errors in subsequent stabilization periods, and the estimated errors in the subsequent stabilization periods are dynamically corrected. After the model is calibrated, the model may be used during subsequent stabilization periods to correct predicted positional errors and perturbations due to the thermal effects. As noted above, thermal effects are only one type effect or variation that may be considered, and is not intended to be a limiting example. The estimated positional errors during the stabilization period may be corrected by dynamically modifying the digital mask of the photolithography system on-the-fly, and are not corrections or changes made to the physical photolithography system itself. The corrections of the estimated positional errors may be dynamic digital corrections applied per plate or per substrate during exposure to the digital mask.

The calibrated model may further be used to monitor the stability of the photolithography system. An alignment model modeling the alignment of the digital mask may be formed based on the calibrated model. The alignment model may then be compared to the alignment of the digital mask during subsequent stabilization periods. The comparison of the alignment model to the alignment during subsequent stabilization periods may be used to determine a similarity metric. The similarity metric may be used to determine whether the subsequent stabilization period is the same as the initial stabilization period used to create the model (i.e., whether the subsequent stabilization period experiences the same positional perturbations as the initial stabilization period). The similarity metric may determine the stability of the system by determining whether the same positional perturbations are repeatedly occurring. If the system is stable, potential positional errors will be easier to estimate, as the same errors will be occurring repeatedly at the same point of time during the stabilization periods.

In at least one implementation, the model may be a machine learning model or problem with model guidance, such as neural-networks. For example, if a large amount of data is available, the photolithography systems may use the plurality of sensors and the large amount of data to proactively correct positional perturbations or errors that have a high frequency of occurrence before the errors occur in subsequent stabilization periods. The systems may use the data, the sensors, and/or the model to estimate or determine errors that have a high frequency of occurrence, and compensate for the potential errors before the errors occur. After compensating for the perturbations or errors having a high frequency of occurrence, the systems may further compare the current printing positions to the model to determine whether the compensation actually corrected the potential error or not, and may make additional adjustments as needed. Thus, instead of correcting errors on-the-fly as they occur, the systems may use the machine learning algorithms to proactively compensate for the potential errors prior to occurrence.

Using the above described methods, photolithography system behaviors may be accurately modeled and calibrated to estimate positional perturbations occurring during the stabilization period, which enhances the total pitch and overlay correction repeatability. The models may then be used to correct overlay and total pitch errors on-the-fly during subsequent stabilization periods of the systems by adjusting the digital mask. Additionally, if a large amount of data is available to the systems, the systems may proactively compensate for potential positional perturbations or errors prior to the occurrence of the errors using a machine learning model with model guidance.

Utilizing the models for dynamic positional corrections may eliminate or reduce costly hardware solutions. The models may easily be used for dynamic positional corrections since the positional corrections are applied to digital masks. Moreover, since the models are a software-based solution, new model forms can be developed to include new effects that were not previously included or covered, or to include additional sensors that were not initially available. As such, the photolithography systems may be accurately utilized for exposure of plates or substrates during their stabilization periods.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
starting a photolithography system and entering a stabilization period;
collecting data and positional readings as the photolithography system prints one or more substrates or one or more calibration plates during the stabilization period, wherein the data collected is temperature data collected using a plurality of temperature sensors disposed throughout the photolithography system;
creating a model based on the data and the positional readings, wherein the model is formed using one or more parameters selected from the following group: where the positional readings should be at during the stabilization period without thermal effects, where the positional readings actually are due to thermal effects, approximations of perturbations of the positional readings, an initial temperature of the photolithography system, and a measured change in temperature from the initial temperature after a predetermined amount of time has passed; and
dynamically correcting estimated errors during subsequent stabilization periods using the model to print one or more substrates during the subsequent stabilization periods.

2. The method of claim 1, wherein the temperature data is collected during heating and cooling periods of the stabilization period.

3. The method of claim 1, wherein the data collected is pressure data.

4. The method of claim 1, wherein the data collected is humidity data.

5. The method of claim 1, wherein the model is a set of cascaded transient models.

6. The method of claim 1, wherein the model is created based on pressure data.

7. The method of claim 1, wherein the model is created based on humidity data.

8. The method of claim 1, wherein the plurality of temperature sensors are disposed near parts of the photolithography system known to fluctuate in temperature during the stabilization period.

9. The method of claim 1, wherein the data is collected using one or more sensors configured to collect pressure data or one or more sensors configured to collect humidity data.

10. The method of claim 1, wherein the dynamic correction is to enhance at least one of precision and accuracy when printing the one or more substrates during the stabilization periods.

11. A method, comprising:
starting a photolithography system and entering a stabilization period;
collecting temperature data and positional readings as the photolithography system prints one or more substrates or one or more calibration plates during the stabilization period, wherein the temperature data is collected during heating and cooling periods using a plurality of temperature sensors disposed throughout the photolithography system;

creating a model based on the temperature data and the positional readings, wherein the model is formed using one or more parameters selected from the following group: where the positional readings should be at during the stabilization period without thermal effects, where the positional readings actually are due to thermal effects, approximations of perturbations of the positional readings, an initial temperature of the photolithography system, and a measured change in temperature from the initial temperature after a predetermined amount of time has passed;

calibrating the model;

using the calibrated model to estimate errors in subsequent stabilization periods; and dynamically correcting the estimated errors during the subsequent stabilization periods to print one or more substrates during the subsequent stabilization periods.

12. The method of claim 11, wherein pressure data is further collected, and the model is created based on the pressure data.

13. The method of claim 11, wherein humidity data is further collected, and the model is created based on the humidity data.

14. The method of claim 11, wherein the model is a set of cascaded transient models.

15. The method of claim 11, wherein the photolithography system comprises one or more sensors configured to collect pressure data or one or more sensors configured to collect humidity data.

16. A method, comprising:

starting a photolithography system and entering a stabilization period;

collecting temperature data and positional readings as the photolithography system prints one or more substrates or one or more calibration plates during the stabilization period, wherein temperature data is collected using a plurality of temperature sensors disposed throughout the photolithography system;

creating a model based on the temperature data and the positional readings, wherein the model is formed using one or more parameters selected from the following group: where the positional readings should be at during the stabilization period without thermal effects, where the positional readings actually are due to thermal effects, approximations of perturbations of the positional readings, an initial temperature of the photolithography system, and a measured change in temperature from the initial temperature after a predetermined amount of time has passed;

forming an optimization problem to determine thermal capacitance and transmission coefficients of the photolithography system;

using the model and optimization problem to estimate errors in subsequent stabilization periods; and dynamically correcting the estimated errors during the subsequent stabilization periods to print one or more substrates during the subsequent stabilization periods.

17. The method of claim 16, wherein pressure data is further collected, and the model is created based on the pressure data.

18. The method of claim 16, wherein humidity data is further collected, and the model is created based on the humidity data.

19. The method of claim 16, wherein the model is a set of cascaded transient models.

20. The method of claim 16, wherein the temperature data is collected during heating and cooling periods of the stabilization period.

21. The method of claim 16, wherein the photolithography system comprises one or more sensors configured to collect pressure data or one or more sensors configured to collect humidity data.

* * * * *